US008454199B2

(12) United States Patent
Deng

(10) Patent No.: US 8,454,199 B2

(45) Date of Patent: Jun. 4, 2013

(54) LED MODULE

(76) Inventor: Jianwei Deng, Nanhai (CN)

( * ) Notice: Subject to any disclaimer, the term of this patent is extended or adjusted under 35 U.S.C. 154(b) by 296 days.

(21) Appl. No.: 13/074,477

(22) Filed: Mar. 29, 2011

(65) Prior Publication Data

US 2012/0097988 A1 Apr. 26, 2012

(51) Int. Cl.
*H01L 33/48* (2010.01)

(52) U.S. Cl.
USPC .......................... 362/249.06; 257/88; 362/394

(58) Field of Classification Search
USPC ................ D26/25; 362/249.06, 391; 439/429
See application file for complete search history.

(56) References Cited

U.S. PATENT DOCUMENTS

| | | | | |
|---|---|---|---|---|
| 5,601,448 | A * | 2/1997 | Poon | 439/419 |
| 5,672,000 | A * | 9/1997 | Lin | 362/249.06 |
| 6,261,119 | B1 * | 7/2001 | Green | 439/425 |
| 6,367,952 | B1 * | 4/2002 | Gibboney, Jr. | 362/249.05 |
| 6,660,935 | B2 * | 12/2003 | Southard et al. | 362/640 |
| 6,866,394 | B1 * | 3/2005 | Hutchins et al. | 362/192 |
| 7,036,962 | B2 * | 5/2006 | Chan | 362/407 |
| 7,114,841 | B2 * | 10/2006 | Aanegola et al. | 362/640 |
| 7,144,139 | B2 * | 12/2006 | Kramer et al. | 362/368 |
| 7,210,957 | B2 * | 5/2007 | Mrakovich et al. | 439/404 |
| 7,217,012 | B2 * | 5/2007 | Southard et al. | 362/391 |
| 7,445,352 | B2 * | 11/2008 | Lin | 362/101 |
| 7,482,636 | B2 * | 1/2009 | Murayama et al. | 257/98 |
| 7,506,995 | B2 * | 3/2009 | Thomas et al. | 362/227 |
| 7,794,132 | B2 * | 9/2010 | Cunius | 362/648 |
| 7,815,341 | B2 * | 10/2010 | Steedly et al. | 362/294 |
| 7,850,341 | B2 * | 12/2010 | Mrakovich et al. | 362/249.06 |
| 2010/0124067 | A1 * | 5/2010 | Hente et al. | 362/398 |

* cited by examiner

*Primary Examiner* — Shaun Campbell
*Assistant Examiner* — Jordan Klein
(74) *Attorney, Agent, or Firm* — Clement Cheng

(57) ABSTRACT

A LED module has a LED chip, LED packaging materials, a metal base circuit board, a power connection cable, a heat sink that also functions as a metal case; and an optional potting material. The LED chip is fixed to the metal base close to the surface of the board. The LED packaging materials forms a package. A power connection line has a continuous uninterrupted power supply line. A continuous power cord from the power connection line is mounted on the metal injection molded parts corresponding fixed location. Self-tapping screws are mounted to the metal base circuit board. The self-tapping screws are formed of metal. A plastic end connector cap is for the power cord. The power connection cable passes through the plastic end connector cap and joins together with the metal case to form a fixed electrical connection by connecting to the power connection cable.

19 Claims, 5 Drawing Sheets

LED MODULE

This application claims priority from China application for an improved LED module by DENG, Jian Wei filed Sep. 26, 2010 having application serial number 201020558143.1 and issued Oct. 21, 2010 with issuance number 2010101800172690.

FIELD OF THE INVENTION

The present invention relates to field of lighting technology, particularly an LED light-emitting diode lighting module.

DISCUSSION OF RELATED ART

Presently, the light-emitting diode (referred to as LED) continues to advance in technology and LED lighting has become more widely used. During operation, the LED has a portion of the input power converted into heat, and due to the very small size of LED chips, LED chips during ordinary operation have great surface heat load density and the chip temperature will rise. The LED module must be set so that the effective thermal cooling channels will have efficient heat transfer and cooling. Known in the traditional structure of LED modules, LED chips formed from the solid crystal layer are fixed on the stent, with packaging materials packaged into LED components. A pin bracket is welded on the circuit board, and a circuit board placed in the enclosure. LED modules have also used moisture resistant surface perfusion circuit board coating material. There may also be a thin layer of air or potting material layer between the circuit boards and the shell.

The heat sources transfer heat as follows: Heat from the LED chip after reaches through the solid support crystal layer is divided into two: all the way through the potting material or to the air to reach the external air environment, and the other routing layer is through circuit board or through the air or potting material to reach the shell layer and then reach the external air by the shell environment. As packaging material, potting material, air and other media has small thermal conductivity, heat dissipation by these means leads to high thermal resistance. Although a stent is made of metal material, the material thermal conductivity is not low, but because of small stent cross-sectional area and slender structure, its composition aspects of the thermal resistance of thermal conductivity is relatively large.

Heat creates some problems. The heat generated during operation leads to poor distribution through a number of areas of high heat resistance, and poor heat dissipation. The LED chip and its contact with the material (epoxy resin, phosphor adhesive mixture) is very sensitive to temperature stability, and high temperature will accelerate the LED chip, epoxy, and phosphor degradation: LED chip luminous efficiency recession, epoxy resin light transmittance decrease due to color changes to yellow, a decline in light conversion efficiency of phosphor. Generally speaking, the chip and its packaging material degrade so that it becomes less efficient which means that more input energy is converted into heat. Therefore, the traditional structure of the cooling module LED is not very good and leads to a shortened life expectancy.

Secondly, the traditional public knowledge of the LED module in the module structure of the power connection cable between the sub-types of welding, the working module is a module of a string of which the entire total current must flow through the module circuit board copper foil, because the module circuit board structural constraints, a string of electrically conducting foil strips cannot be made too wide or too short. Conducting an effective cross-sectional area cannot be too small and the same applies to the small cross-sectional area of the conductor.

SUMMARY OF THE INVENTION

A LED module has a LED chip, LED packaging materials, a metal base circuit board, a power connection cable, a heat sink that also functions as a metal case; and an optional potting material. The LED chip is fixed to the metal base close to the surface of the board. The LED packaging materials forms a package. A power connection line has a continuous uninterrupted power supply line. A continuous power cord from the power connection line is mounted on the metal injection molded parts corresponding fixed location. Self-tapping screws are mounted to the metal base circuit board. The self-tapping screws are formed of metal. A plastic end connector cap is for the power cord. The power connection cable passes through the plastic end connector cap and the plastic end connector cap joins together with the metal case to form a fixed electrical connection by connecting to the power connection cable.

The LED chip has a solid-crystal layer by welding or bonding and is fixed on an upper surface of the metal base circuit board. The self-tapping screws are made of metal and penetrate the metal base circuit board and also the plastic end connector cap to make electrical connection with positive and negative terminals of the power cord, to achieve a fixed electrical connection. Large areas of metal matrix laminated board are fixed on the metal enclosure. The LED module has connection between a metal casing and a metal base circuit board by the way of fastener preload. The Fixed LED chips can optionally be an integrated heat sink LED chip or integrated LED package parts. An encapsulating member for the LED packaging materials comprises silicone or rubber or epoxy.

An object of the invention is to have a long length capability. The length traditionally has limitations because the resistance of the conductor being proportional to the length and inversely proportional to the cross-sectional area. The sum of each resistance of each module to power each module is cumulative and the equivalent of a string of copper resistance is not small. After each cascaded module, the resistance of the module is in parallel with the parent, when the current flows through the resistor a voltage drop will be produced. An object of the invention is to have a minimum module brightness difference from the power supply side terminal and the further end.

An object of the invention is to overcome the lack of existing technology to effectively and quickly transfer away the heat generated by the chip while addressing the differences in brightness and number of the improved cascade LED module.

The present invention includes an improved LED module, including the LED chip, LED packaging materials, metal base circuit board, power connection cable, doubles as a heat sink metal case and the choice of moisture sealing materials. The LED chip is mounted close to the metal base circuit board fixed to the surface. The use of LED materials packaging is characterized as including a power connection line with a continuous uninterrupted power supply line, a continuous power cord from the power cord mounted fixed injection corresponding positions of the metal shell by tapping the metal base circuit board, metal, plastic mosaic pieces of the power cord, power cord through a row and join together to form the structure of a fixed electrical connection at the same time.

Furthermore, the LED chip crystal layer is formed by welding or solid bonding fixed on the surface of the metal base circuit board and using an LED packaging materials package. At least two self-tapping screws penetrate the metal base circuit board. These parts can be made as a metal injection molded part for greater thermal conductivity. The respective positive and negative power line with a continuous line of connections can achieve a fixed electrical connection and structure.

A large area of metal matrix laminated circuit board is preferably fixed to the metal enclosure. The metal and metal base circuit board can be prestressed or machined to form a reliable connection and provide fastener preload. The fixed LED chips can be one with a heat sink already formed to the LED chip or the LED package parts. Continuous inserts of the power cord and metal injection molding are pre-stressed and machining a viable electrical connection means can also be used to provide fastener preload. Potting material can be silicone rubber or epoxy or fluorescence. Self-tapping screws can be any conventional shape assuming material conductivity is good.

It is preferred that the LED chip or LED package are directly fixed on the surface of the metal base circuit board, especially when the heat generated by the LED provides rapid transfer from metal base circuit board to the metal shell, the metal surface rapidly expands distribution of heat to the external air environment, which greatly improved the LED's working environment, effectively protect the LED's working life.

Another object of the present invention is to use a continuous copper power cord so as to reduce the voltage drop across the module string on the cascade module, as compared to a module using copper foil, to minimize the brightness difference at the end further from the power supply.

The following call out list of elements is a useful guide in referencing the elements of the drawings.

10 Metal Base Circuit Board
20 LED Chip
30 LED Packaging Materials
40 Metal Shell
50 Continuous Power Supply Line
60 Self-Tapping Screws
70 Power Cord End Cap Connector

DETAILED DESCRIPTION OF THE PREFERRED EMBODIMENT

Figure 1:
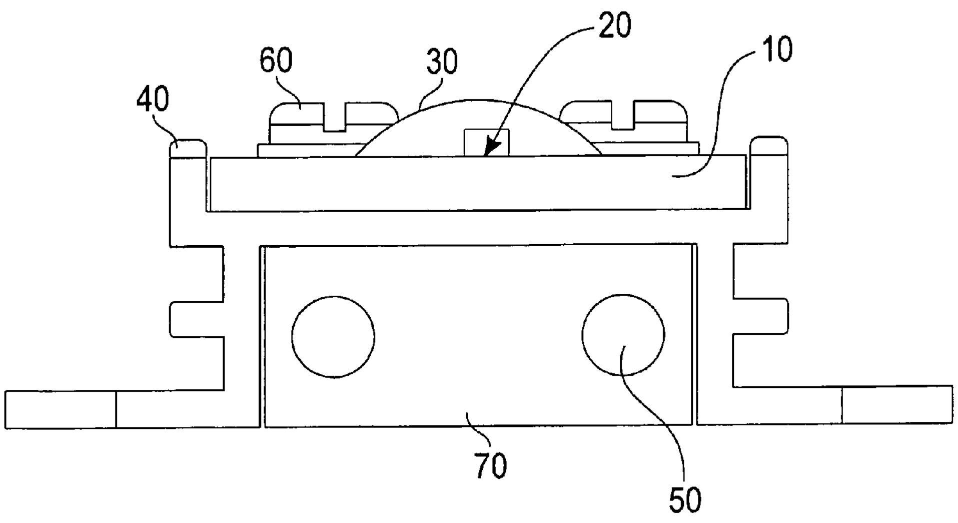
FIG. 1 is a schematic of the invention.
Figure 2:
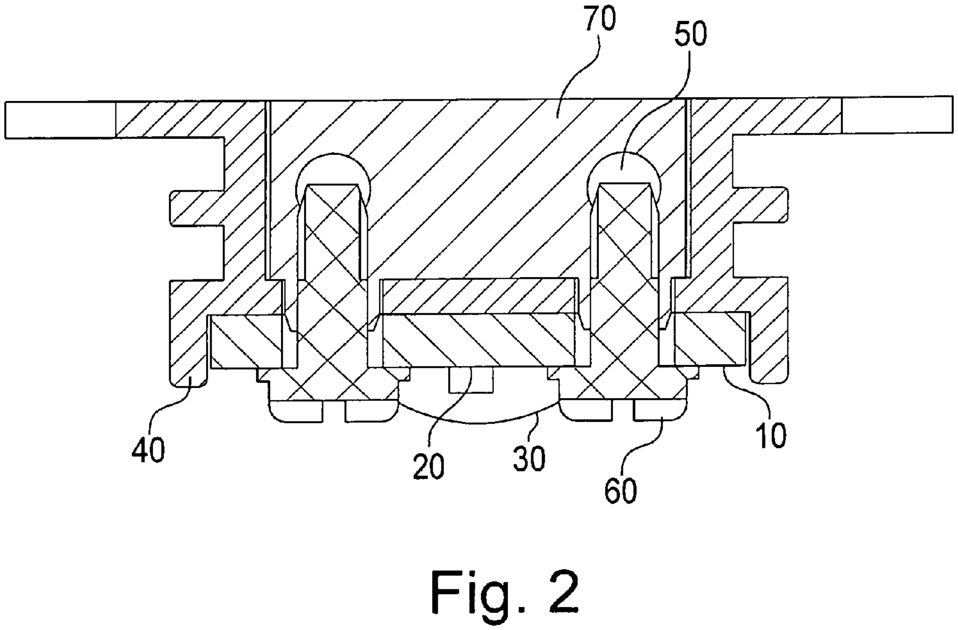
FIG. 2 is a cross-section diagram of FIG. 1.
Figure 3:
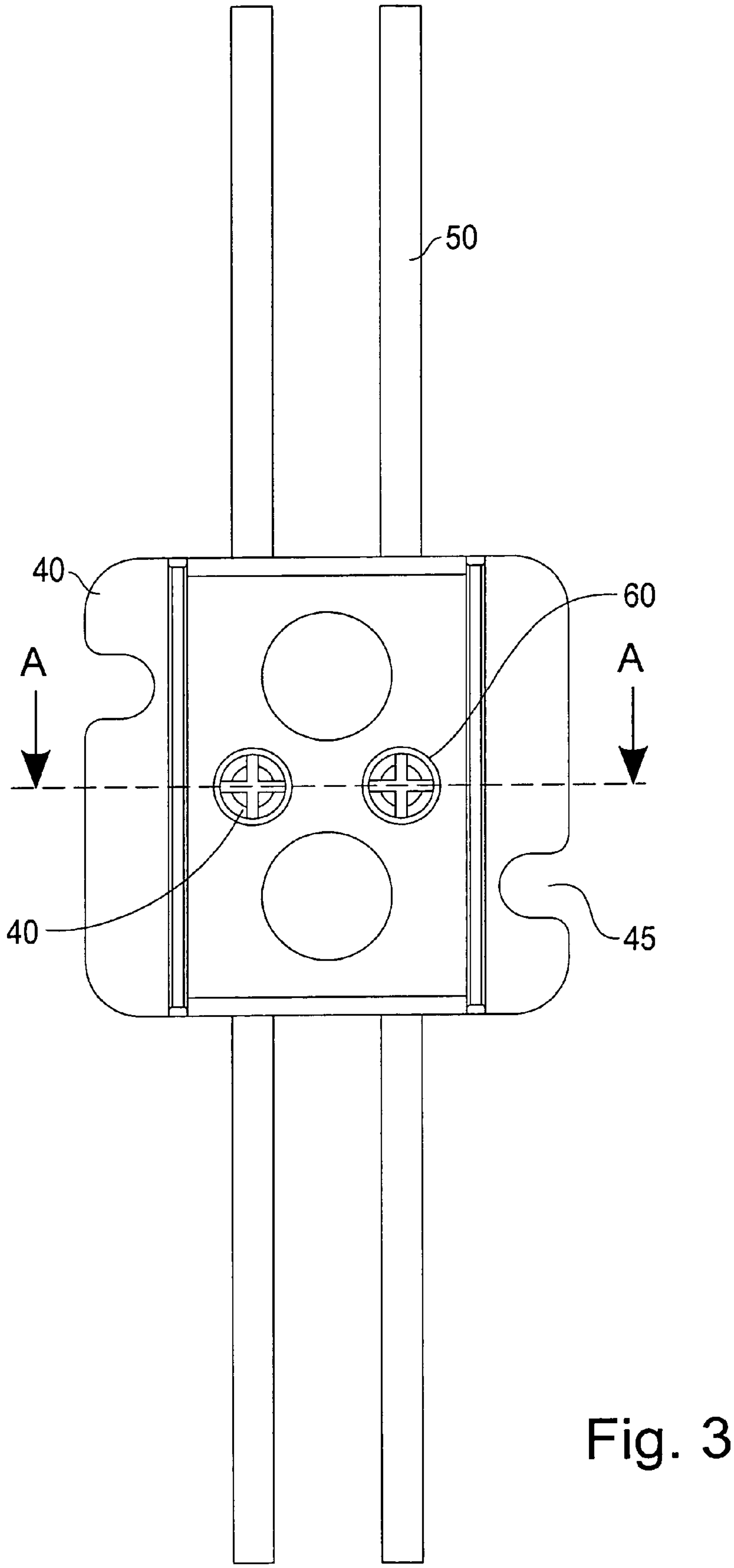
FIG. 3 is a top view of the present invention.
Figure 4:
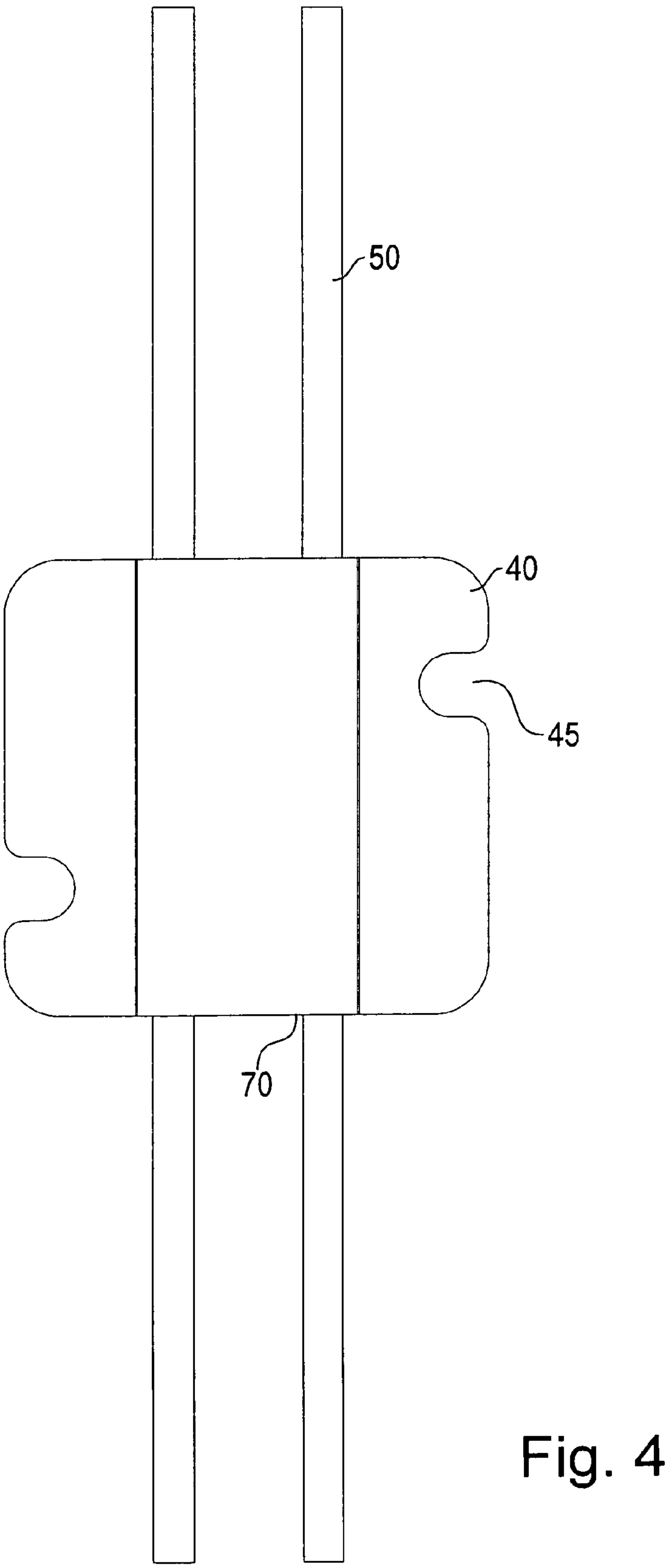
FIG. 4 is a bottom view of the present invention.
Figure 5:
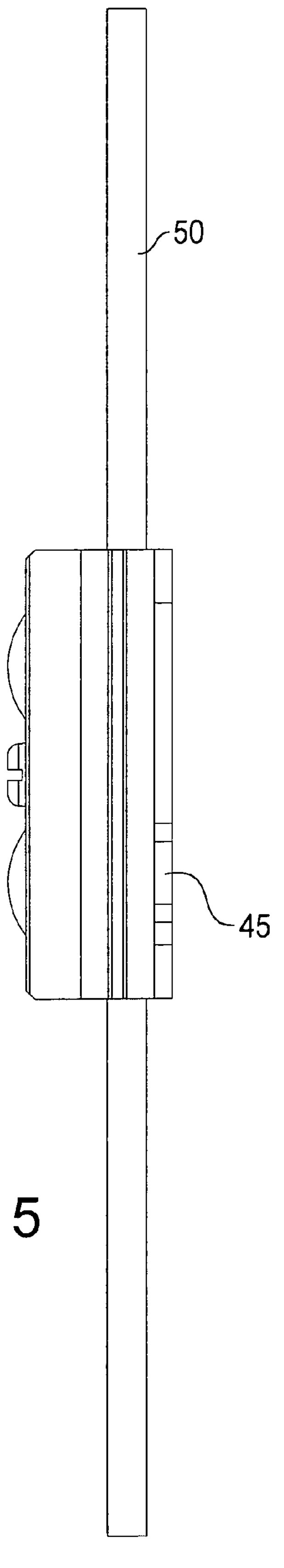
FIG. 5 is a left side view of the present invention.
Figure 6:
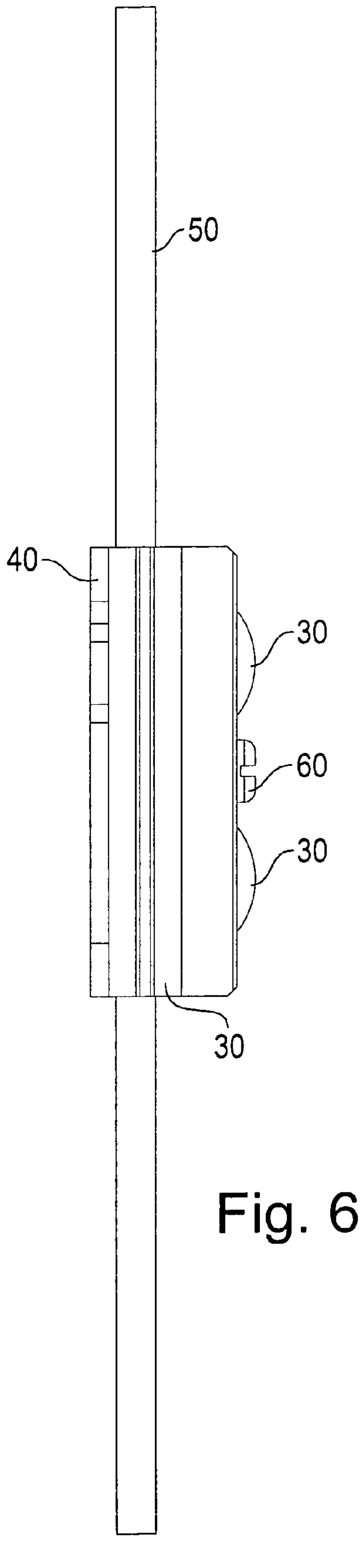
FIG. 6 is a right side view of the present invention.
Figure 7:
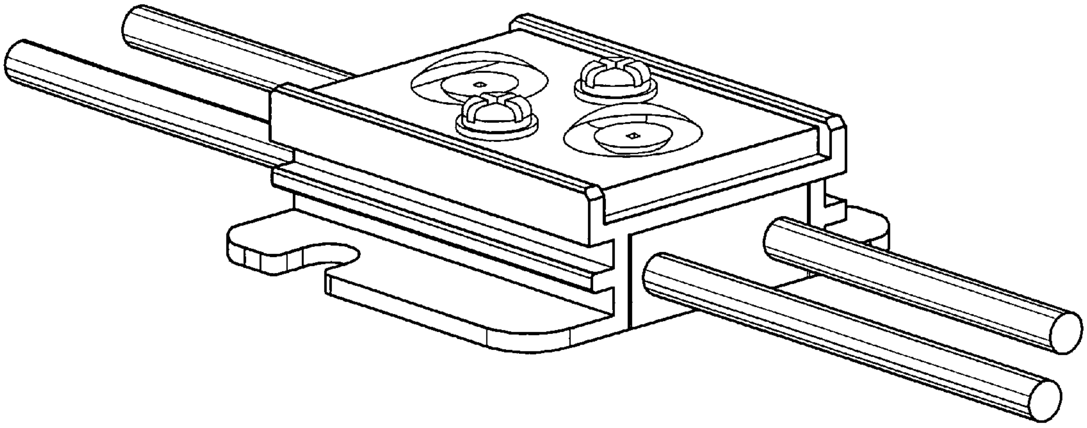
FIG. 7 is a perspective view of the present invention.

As seen in FIGS. 1 and 2, this embodiment of the LED modules is constructed mainly by the metal base circuit board 10, LED chip 20, LED packaging materials 30, the metal shell 40, a continuous power supply line 50, self-tapping screws 60, power cord end cap connector 70 also called an injection mosaic 70 and the optional parts potting material. The module may further include LED packaging materials 30 and optionally a regular silicone potting material or fluorescent plastic or epoxy. The LED chip 2 is fixed by welding solid crystal layer on the metal base circuit board 10 on the surface and using LED packaging materials 30 package. The power lines go through the middle and continue. The continuous power line 50 is unbroken and the continuous power supply line 50 passes through the module. The preferably plastic injection molded power cord end cap connector line 70 is fixed on the back of the metal shell 40, and corresponds with the screw hole location, so as to outline the power supply lines.

The metal base circuit board 10 has a large area fixing to the metal shell 40. The self-tapping screws 60 pass through the metal base circuit board 10, and the metal shell 40, and the power cord end cap connector 70, so as to provide a continuous power supply line 50 preferably arranged in parallel as a whole. The self-tapping screws connect everything together both electrically and structurally. There are at least a pair of self tapping screws 60 that electrically connect by penetration of the components, namely the continuous power line and the respective positive and negative wire connections, to achieve electrical connection and physical structural rigidity connection.

Encapsulating materials may be needed while filling in on the metal base circuit board 10, so that the whole assembly completely sealed and water resistant or watertight. The present embodiment is preferably configured so that LED modules and LED chip 20 transfer heat through the following thermal cooling pathways: First, LED packaging materials 30 reach the external air environment; second, heat in the LED chip 20 transfers to the solid crystal layer then to the solid metal base circuit board 10, which then transfers to the metal shell 40, then transfers to the outside air environment. The module can be configured so that the LED chip 20 generates heat and the majority of the heat generated passes directly through the metal base circuit board 10 and metal shell 40 so that heat is radiated from the metal shell. The LED module and LED chip preferably passes a certain percentage heat to the ambient air depending upon thermal resistance configuration of the LED module. Metal shell 40 has a flange with a cut out 45 for receiving a mounting hardware connector such as a screw.

It is desired that the LED module and LED chip temperature will be lower than traditional LED modules. With the present construction, and with thermal calculations, it is desired that the LED module and LED chip provide a lowlight decay and long life. It is also decided that a continuous power supply module string line 50 will have lower voltage drop compared to traditional LED modules. The modules can be formed according to the above structure and cascaded more strings away from the power supply side terminal with the possibility to minimum the differences in brightness.

The foregoing describes the preferred embodiments of the invention. Modifications may be made without departing from the spirit and scope of the invention as set forth in the following claims. The present invention is not limited to the embodiments described above, but encompasses any and all embodiments within the scope of the following claims. For example, in addition, the design may also incorporate a heat sink LED chip or LED package fixed the same way that the metal base circuit board is bonded to the to the heat sink LED chip or LED package. The metal base circuit board and metal shell shape, structure, mode of arrangement may be in response to specific applications for a variety of changes. Therefore, while the presently preferred form of the invention has been shown and described, and several modifications thereof discussed, persons skilled in this art will readily appreciate that various additional changes and modifications may be made without departing from the spirit of the invention, as defined and differentiated by the following claims.

The invention claimed is:

1. A LED module comprising:
a LED chip;
LED packaging materials, which form a package;
a metal base circuit board; wherein the LED chip is fixed to the metal base circuit board close to the surface of the board;
a heat sink that also functions as a metal case;
a power connection line that is a continuous uninterrupted power supply line and mounted to the metal case at a corresponding fixed location;
self-tapping screws mounted to the metal base circuit board, wherein the self-tapping screws are formed of metal and have tips that pierce into the power connection line to make electrical connection to the power connection line;
a plastic end connector cap for the power connection line, wherein the power connection line passes through the plastic end connector cap and the plastic end connector cap joins together with the metal case to form a fixed electrical connection by connecting to the power connection line.

2. The LED module of claim 1, wherein on the LED module, the LED chip has a solid-crystal layer affixed by welding or bonding to an upper surface of the metal base circuit board.

3. The LED module of claim 2, wherein the self-tapping screws are made of metal and penetrate the metal base circuit board and also the plastic end connector cap to make electrical connection with positive and negative terminals of the power connection line to achieve a fixed electrical connection.

4. The LED module of claim 2, wherein the LED module is characterized by large areas of metal matrix laminated board fixed on the metal case.

5. The LED module of claim 2, wherein the LED module has connection between a metal casing and a metal base circuit board by the way of fastener preload.

6. The LED module of claim 2, wherein fixed LED chips are integrated heat sink LED chips or integrated LED package part.

7. The LED module of claim 2, further comprising an encapsulating member for the LED packaging materials comprising: silicone or rubber or epoxy.

8. The LED module of claim 1, wherein the self-tapping screws are made of metal and penetrate the metal base circuit board and also the plastic end connector cap to make electrical connection with positive and negative terminals of the power connection line, to achieve a fixed electrical connection.

9. The LED module of claim 8, wherein the LED module is characterized by large areas of metal matrix laminated board fixed on the metal case.

10. The LED module of claim 8, wherein the LED module has connection between a metal casing and a metal base circuit board by the way of fastener preload.

11. The LED module of claim 8, wherein fixed LED chips are integrated heat sink LED chips or integrated LED package parts.

12. The LED module of claim 8, further comprising an encapsulating member for the LED packaging materials comprising: silicone or rubber or epoxy.

13. The LED module of claim 1, wherein the LED module is characterized by large areas of metal matrix laminated board fixed on the metal case.

14. The LED module of claim 13, wherein the LED module has connection between a metal casing and a metal base circuit board by the way of fastener preload.

15. The LED module of claim 13, wherein fixed LED chips are integrated heat sink LED chips or integrated LED package parts.

16. The LED module of claim 13, further comprising an encapsulating member for the LED packaging materials comprising: silicone or rubber or epoxy.

17. The LED module of claim 1, wherein the LED module has connection between a metal casing and a metal base circuit board by the way of fastener preload.

18. The LED module of claim 1, wherein fixed LED chips are integrated heat sink LED chip or integrated LED package parts.

19. The LED module of claim 1, further comprising an encapsulating member for the LED packaging materials comprising: silicone or rubber or epoxy.

* * * * *